(12) United States Patent
Chou et al.

(10) Patent No.: US 7,940,089 B2
(45) Date of Patent: May 10, 2011

(54) PEAK-DETECT-AND-HOLD CIRCUIT AND METHOD THEREOF USING RAMP SAMPLING TECHNIQUE

(75) Inventors: Hwai-Pwu Chou, Hsinchu (TW); Chien-Jen Lin, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 78 days.

(21) Appl. No.: 12/574,411

(22) Filed: Oct. 6, 2009

(65) Prior Publication Data

US 2011/0057706 A1    Mar. 10, 2011

(30) Foreign Application Priority Data

Sep. 4, 2009   (TW) .................................... 98129818

(51) Int. Cl.
    *G01R 19/00* (2006.01)
(52) U.S. Cl. .......................................... 327/60; 327/95
(58) Field of Classification Search .................. None
    See application file for complete search history.

(56) References Cited

U.S. PATENT DOCUMENTS

| | | | | |
|---|---|---|---|---|
| 5,210,527 A | * | 5/1993 | Smith et al. | 340/659 |
| 6,215,335 B1 | * | 4/2001 | Rabii | 327/74 |
| 7,583,944 B2 | * | 9/2009 | Kurz | 455/240.1 |

* cited by examiner

*Primary Examiner* — Lincoln Donovan
*Assistant Examiner* — Sibin Chen
(74) *Attorney, Agent, or Firm* — Muncy, Geissler, Olds, & Lowe, PLLC

(57) ABSTRACT

A peak detect-and-hold circuit and method thereof using ramp sampling technique includes utilizing two sampling signals of different slopes to sample an input voltage for respective tracking voltages; comparing the held tracking voltage sampled with the sampling signal of a smaller slope and the input voltage to determine whether the input voltage is rising or falling, and if the input voltage starts falling, the held tracking voltage sampled with the sampling signal of a larger slope is taken as the peak. The peak detect-and-hold circuit using ramp sampling technique controls respective tracking voltages by comparing the input voltage with the sampling signals rather than the feedback tracking voltage. Also, it uses the input voltage directly rather than an operational transconductance amplifier to charge holding capacitors for the tracking voltages. Therefore, the errors of peak detecting and holding, namely the pedestal voltage, overshoot voltage and voltage droop are reduced.

15 Claims, 4 Drawing Sheets

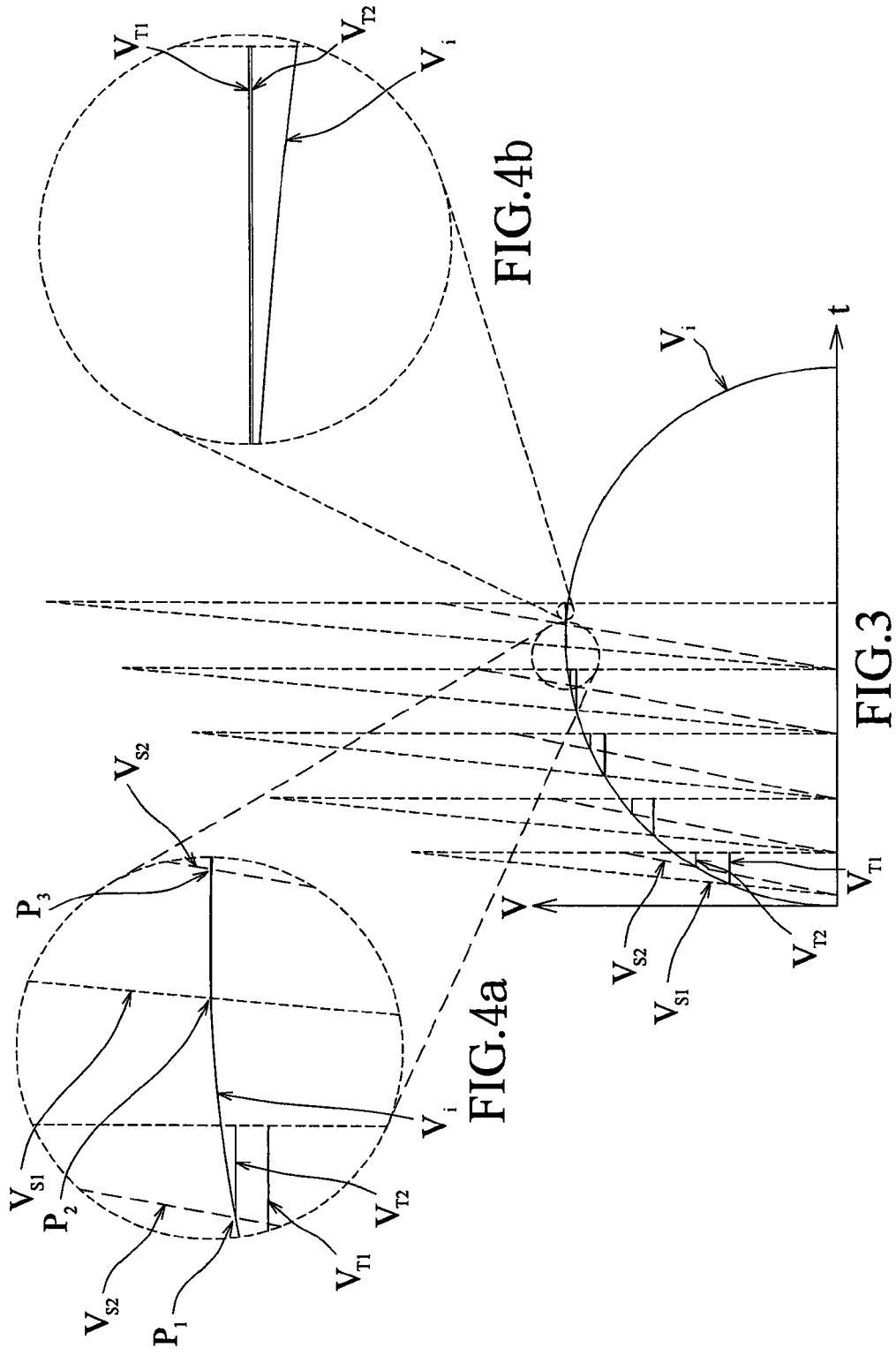

PEAK-DETECT-AND-HOLD CIRCUIT AND METHOD THEREOF USING RAMP SAMPLING TECHNIQUE

BACKGROUND OF THE INVENTION

1. Field of the Invention

The present invention relates to a peak detect-and-hold circuit and method thereof, more particularly to a peak detect-and-hold circuit and method thereof using a ramp sampling technique.

2. Description of the Related Art

Generally, a peak detect-and-hold circuit is for detecting and holding the peak voltage of a voltage wave such as a sinusoidal wave. Its applications include nuclear pulse spectroscopy and automatic gain control, etc.

FIG. 1 is a circuit diagram illustrating a conventional peak detect-and-hold circuit. As shown in the figure, the conventional peak detect-and-hold circuit receives an input voltage $V_i$, and outputs a tracking voltage $V_T$. It includes an operational transconductance amplifier OTA, a diode D, and a holding capacitor $C_h$. The positive terminal and the negative terminal of the operational transconductance amplifier OTA receive the input voltage $V_i$ and the feedback tracking voltage $V_T$, respectively. When the tracking voltage $V_T$ is smaller than the input voltage $V_i$, indicating the input voltage $V_i$ is still rising, the operational transconductance amplifier OTA conducts the diode D and charges the holding capacitor $C_h$ so that the tracking voltage $V_T$ keeps tracking the input voltage $V_i$; when the input voltage $V_T$ is equal to the tracking voltage $V_T$, the operational transconductance amplifier OTA cuts off the diode, and stops charging the holding capacitor $C_h$ so as to hold the tracking voltage $V_T$ at the peak voltage.

Therefore, a function of the operational transconductance amplifier OTA is to control the conduction of the diode D based on the comparison of the tracking voltage $V_T$ and the input voltage $V_i$. Accordingly, the input voltage $V_i$ may be tracked by the tracking voltage across the holding capacitor $C_h$ until the peak voltage has been reached. The other function of the operational transconductance amplifier OTA is being the charging current source of the holding capacitor $C_h$.

There are three typical types of error of the conventional peak detect-and-hold circuit, namely the pedestal voltage, overshoot voltage and voltage droop, as illustrated in the waveform diagram of FIG. 2. The pedestal voltage is the constant difference between the input voltage $V_i$ and the tracking voltage $V_T$, caused, for example, by the offset error of the operational transconductance amplifier OTA. The overshoot voltage refers to the amount of the tracking voltage $V_T$ exceeding the peak voltage, caused by the delay of the operational transconductance amplifier OTA to cut off the diode D when the tracking voltage $V_T$ reaches the peak voltage of the input voltage $V_i$. Voltage droop is the gradual decrease of the tracking voltage $V_T$ after the holding capacitor $C_h$ is stopped being charged, caused by the leakage through the parasitic capacitors of the diode D and the operational transconductance amplifier OTA connected with the holding capacitor $C_h$.

Hence, the present invention proposes a peak detect-and-hold circuit and method thereof using a ramp sampling technique to reduce the errors of peak detecting and holding, namely the pedestal voltage, overshoot voltage and voltage droop.

SUMMARY OF THE INVENTION

The present invention proposes a peak detect-and-hold circuit and method thereof using a ramp sampling technique which replaces the operational transconductance amplifier of the conventional peak detect-and-hold circuit to reduce the errors of peak detecting and holding, namely the pedestal voltage, overshoot voltage and voltage droop.

The peak detect-and-hold circuit according to an embodiment includes a sampling signal generator, a first comparator, a first sample-and-hold circuit, a second comparator, a second sample-and-hold circuit, and a third comparator.

The sampling signal generator produces at least a first sampling signal and a second sampling signal, wherein the first sampling signal and the second sampling signal are rising waveforms, and the slope of the first sampling signal is greater than that of the second sampling signal. The rising waveforms may be linear or nonlinear, and according to an embodiment, the rising waveforms are ramps. Also according to an embodiment, the slope of the first sampling signal is approximately two times the slope of the second sampling signal. Moreover, according to an embodiment, the slopes of the first sampling signal and the second sampling signal are within 1% of the input voltage amplitude over its peaking time.

The first comparator receives the first sampling signal generated by the sampling signal generator and the input voltage. The first sample-and-hold circuit is controlled by the first comparator to keep a first tracking voltage tracking the input voltage when the first sampling signal is less than the input voltage, and to sample the input voltage and hold the first tracking voltage at the sampled input voltage when the first sampling signal is equal to the input voltage.

The second comparator receives the second sampling signal generated by the sampling signal generator and the input voltage. The second sample-and-hold circuit is controlled by the second comparator to keep a second tracking voltage tracking the input voltage when the second sampling signal is less than the input voltage, and to sample the input voltage and hold the second tracking voltage at the sampled input voltage when the second sampling signal is equal to the input voltage.

The third comparator receives the second tracking voltage and the input voltage, wherein when the second tracking voltage is smaller than the input voltage the third comparator triggers the sampling signal generator to generate another of the first sampling signal and another of the second sampling signal; and when the second tracking voltage is greater than the input voltage, the first tracking voltage is taken as the peak voltage.

The peak detect-and-hold circuit using the ramp sampling technique mentioned above compares the second tracking voltage and the input voltage to determine whether to generate new sampling signals and then based on the comparison of the input voltage and each sampling signal, track the input voltage or hold at a sampled input voltage, or to take the first tracking voltage as the peak voltage. The function of determining whether the peak voltage has been reached of the conventional operational transconductance amplifier by comparing the input voltage and the tracking voltage may thus be replaced.

The peak detect-and-hold circuit using the ramp sampling technique according to an embodiment adopts non-feedback sample-and-hold circuits so as to charge the holding capacitor directly by the input voltage, replacing the function of being the charging current source of the conventional transconductance amplifier.

The peak detect-and-hold method using the ramp sampling technique according to an embodiment includes the following steps. First, a first sampling signal and a second sampling signal are generated, wherein the first sampling signal and the second sampling signal are rising waveforms, and the slope of the first sampling signal is greater than that of the second sampling signal.

Then, the first sampling signal is compared with the input voltage, wherein when the first sampling signal is smaller than the input voltage, the first tracking voltage is kept tracking the input voltage, and when the first sampling signal is equal to the input voltage, the input voltage is sampled and the first tracking voltage is held at the sampled input voltage.

Meanwhile, the second sampling signal is compared with the input voltage, wherein when the second sampling signal is smaller than the input voltage, the second tracking voltage is kept tracking the input voltage, and when the second sampling signal is equal to the input voltage, the input voltage is sampled and the second tracking voltage is held at the sampled input voltage.

Then, the tracking voltage is compared with the input voltage, wherein when the second tracking voltage is smaller than the input voltage, another of the first sampling signal and another of the second sampling signal are generated so as to proceed with the comparing steps; when the second tracking voltage is greater than the input voltage, the first tracking voltage is taken as the peak voltage.

BRIEF DESCRIPTION OF THE DRAWINGS

The objectives, technical contents and characteristics of the present invention can be more fully understood by reading the following detailed description of the preferred embodiments, with reference made to the accompanying drawings, wherein:

FIG. 3 is a waveform diagram illustrating the peak detect-and-hold method using ramp sampling technique according to an embodiment of the present invention;

FIG. 4a and FIG. 4b are waveform diagrams illustrating portions of the FIG. 3 zoomed in;

DETAILED DESCRIPTION OF THE INVENTION

Figure 1:
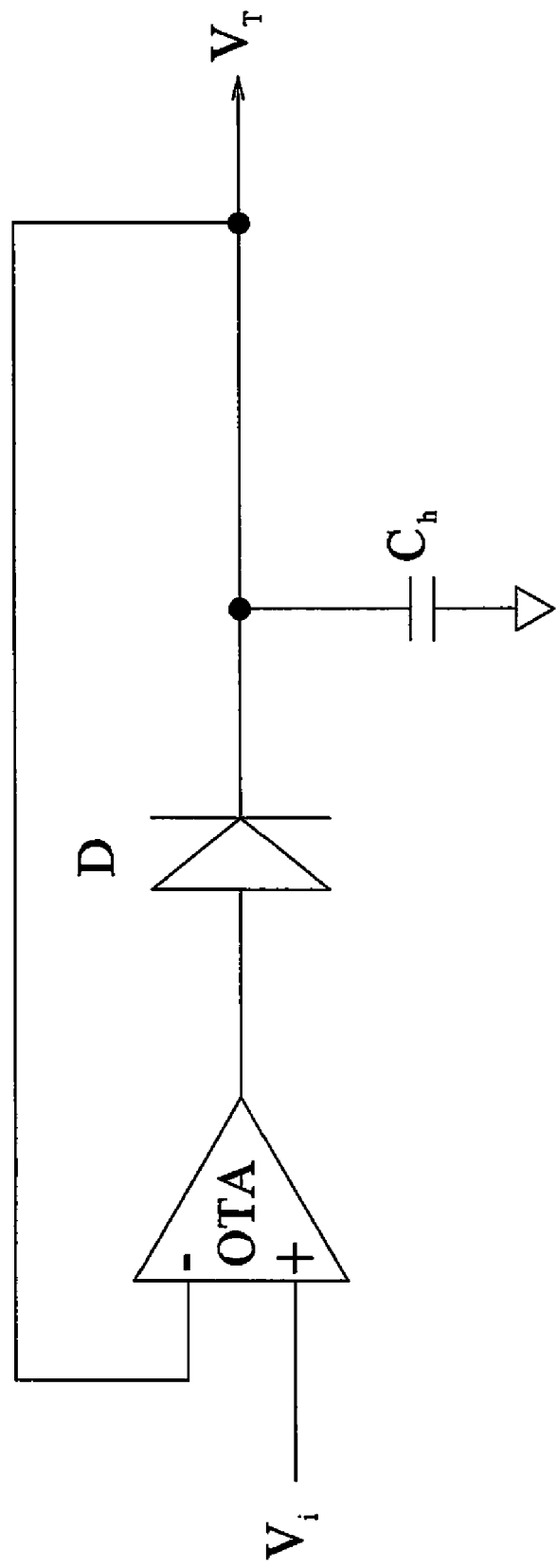
FIG. 1 is a circuit diagram illustrating a conventional peak detect-and-hold circuit.
Figure 2:
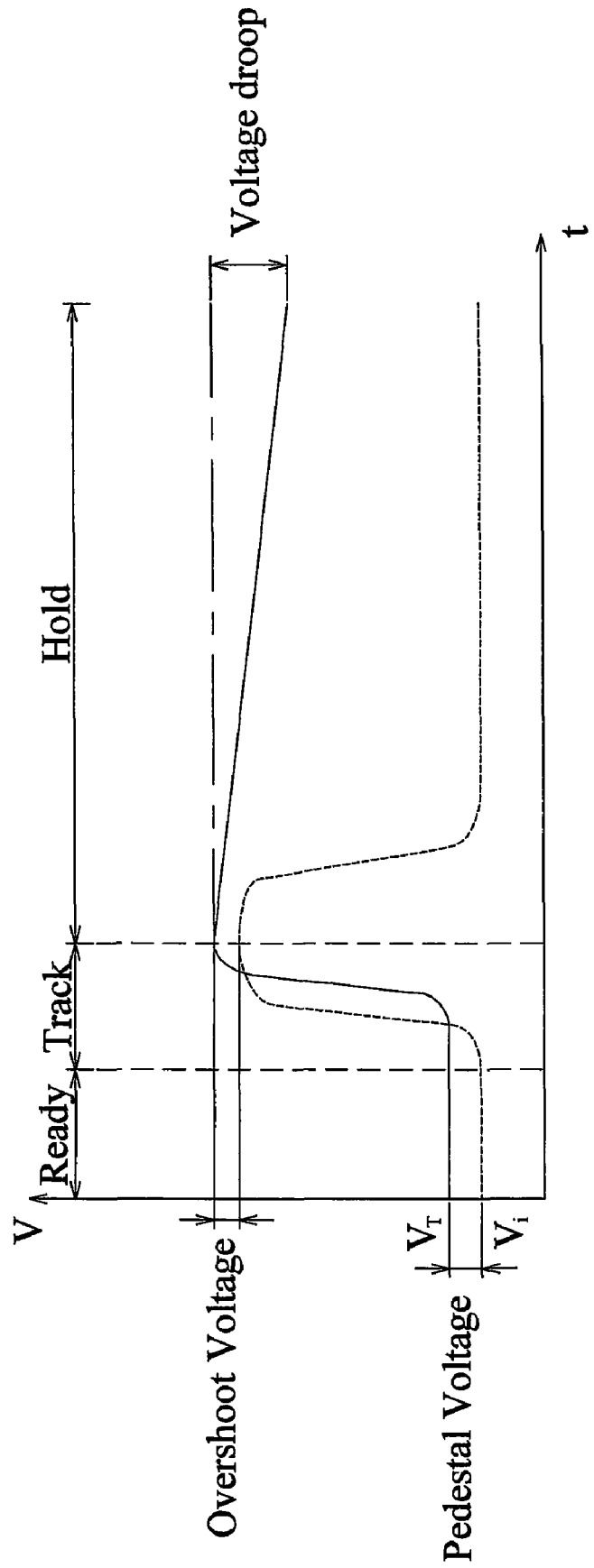
FIG. 2 is a waveform diagram of the input voltage and the tracking voltage illustrating three types of error of the conventional peak detect-and-hold circuit.

Generally, a peak detect-and-hold circuit is for detecting and holding the peak voltage of a voltage wave such as a sinusoidal wave. The operational transconductance amplifier of the conventional peak detect-and-hold circuit provides the function of controlling the tracking voltage to keep tracking the input voltage or holding at a peak voltage based on the comparison of the input voltage and the tracking voltage, and the function of being the charging current source of the holding capacitor. However, it also becomes one of the sources of the three types of error—the pedestal voltage, overshoot voltage and voltage droop.

The present invention proposes a peak detect-and-hold circuit and method thereof using a ramp sampling technique, which replaces the operational transconductance amplifier of the conventional peak detect-and-hold circuit to reduce the errors of peak detecting and holding, namely the pedestal voltage, overshoot voltage and voltage droop.

The peak detect-and-hold method using the ramp sampling technique according to an embodiment includes the following steps with reference made to the waveform diagrams of FIG. 3, FIG. 4a, and FIG. 4b, wherein FIG. 4a and FIG. 4b show portions of FIG. 3 zoomed in:

generating at least a first sampling signal $V_{S1}$ and a second sampling signal $V_{S2}$, wherein the first sampling signal $V_{S1}$ and the second sampling signal $V_{S2}$ are rising waveforms, and the slope of the first sampling signal $V_{S1}$ is greater than that of the second sampling signal $V_{S2}$;

comparing the first sampling signal $V_{S1}$ and the input voltage $V_i$, to determine whether to keep the first tracking voltage $V_{T1}$ tracking the input voltage $V_i$, or to sample the input voltage $V_i$ and hold the first tracking voltage $V_{T1}$ at the sampled input voltage $V_i$;

comparing the second sampling signal $V_{S2}$ and the input voltage $V_i$, to determine whether to keep the second tracking voltage $V_{T2}$ tracking the input voltage $V_i$, or to sample the input voltage $V_i$ and hold the second tracking voltage $V_{T2}$ at the sampled input voltage $V_i$; and comparing the second tracking voltage $V_{T2}$ and the input voltage $V_i$, to determine whether to generate another of the first sampling signal $V_{S1}$ and another of the second sampling signal $V_{S2}$ so as to proceed with comparing steps, or take the first tracking voltage $V_{T1}$ as the peak voltage.

As illustrated in FIG. 3, the first sampling signal $V_{S1}$ is a rising waveform, which gradually rises after being generated until crosses the input voltage and samples at the cross point. Accordingly, in the step of comparing the first sampling signal $V_{S1}$ and the input voltage $V_i$, when the first sampling signal $V_{S1}$ is smaller than the input voltage $V_i$, the first tracking voltage $V_{T1}$ keeps tracking the input voltage $V_i$ (only the input voltage $V_i$ is shown in the figure for the overlapping portion of the input voltage $V_i$ and the first tracking voltage $V_{T1}$); when the first sampling signal $V_{S1}$ is equal to the input voltage $V_i$, the input voltage $V_i$ is sampled and the first tracking voltage $V_{T1}$ is maintained at the sampled input voltage $V_i$ level. (as shown by the level portion of $V_{T1}$ in the figure).

As illustrated in FIG. 3, the sampling method of the second sampling signal $V_{S2}$ and the first sampling signal $V_{S1}$ are the same. Accordingly, in the step of comparing the second sampling signal $V_{S2}$ and the input voltage $V_i$, when the second sampling signal $V_{S2}$ is smaller than the input voltage $V_i$, the second tracking voltage $V_{T2}$ keeps tracking the input voltage $V_i$ (only the input voltage $V_i$ is shown in the figure for the overlapping portion of the input voltage $V_i$ and the second tracking voltage $V_{T2}$); when the second sampling signal $V_{S2}$ is equal to the input voltage $V_i$, the input voltage $V_i$ is sampled and the second tracking voltage $V_{T2}$ is maintained at the sampled input voltage $V_i$ level. (as shown by the level portion of $V_{T2}$ in the figure).

The slope of the first sampling signal $V_{S1}$ is greater than that of the second sampling signal $V_{S2}$ according to an embodiment; therefore, the input voltage $V_i$ is first sampled by the first sampling signal $V_{S1}$ and then by the second sampling signal $V_{S2}$. Consequently, the first tracking voltage $V_{T1}$ and the second tracking voltage $V_{T2}$ enters the holding state in the same order, as illustrated in FIG. 3. When in the holding state, the second tracking voltage $V_{T2}$ is compared with the input voltage $V_i$. When the second tracking voltage $V_{T2}$ is less than the input voltage $V_i$, indicating that the input voltage $V_i$ is still rising, another of the first sampling signal $V_{S1}$ and another of the second sampling signal $V_{S2}$ are generated, and the comparing steps are resumed in order to keep tracking the input voltage $V_i$; when the second tracking voltage $V_{T2}$ is greater than the input voltage $V_i$, indicating that the input voltage $V_i$ has passed the peak and starts falling, the first tracking voltage $V_{T1}$ is taken as the peak voltage.

The reason to take the first tracking voltage $V_{T1}$ as the peak voltage is described below, with reference made to FIG. 3, FIG. 4a and FIG. 4b. At the marked sampling point $P_3$ in FIG. 4a, the held second tracking voltage $V_{T2}$ is greater than the input voltage $V_i$, indicating that at such instance, the input voltage is falling, as shown in FIG. 4b. On the other hand, at the marked sampling point $P_1$ in FIG. 4a, the tracking voltage $V_{T2}$ is still smaller than the input voltage $V_i$, indicating that at such instance, the input voltage is rising. Therefore, in between the two sampling points $P_1$ and $P_3$ lies the peak. Because the first sampling signal $V_{S1}$ samples the input voltage $V_i$ earlier than the second sampling signal $V_{S2}$ does, it is highly probable that the sampling point $P_2$ of the first sampling signal $V_{S1}$ between two sampling points $P_1$ and $P_3$ of the second sampling signal $V_{S2}$ is closer to the peak, as illustrated in FIG. 4b. According to an embodiment as shown in FIG. 3, the slope of the first sampling signal $V_{S1}$ is approximately two times the slope of the second sampling signal $V_{S2}$. In different embodiments, three or more sampling signals with different slopes may be used, but it is noted that the effects of increasing the number of sampling signals is not significant.

Besides, in the embodiment shown in FIG. 3, the rising waveforms are ramps, of which the slopes are constant with respect to time t, i.e. the waveforms are linear. Additionally according to an embodiment, the slopes of the first sampling signal $V_{S1}$ and the second sampling signal $V_{S2}$ are within 1% of the amplitude over the peaking time of the input voltage $V_i$. Peaking time refers to the time when a waveform rises from 0 to peak. Generally speaking, the greater the slopes of the first sampling signal $V_{S1}$ and the second sampling signal $V_{S2}$, i.e. the greater the sampling frequency, the closer the sampled peak to the actual peak. According to different embodiments, the rising waveforms may be nonlinear, and in such case, the instantaneous tangent slope of the first sampling signal $V_{S1}$ is larger than that of the second sampling signal $V_{S2}$.

Figure 5:
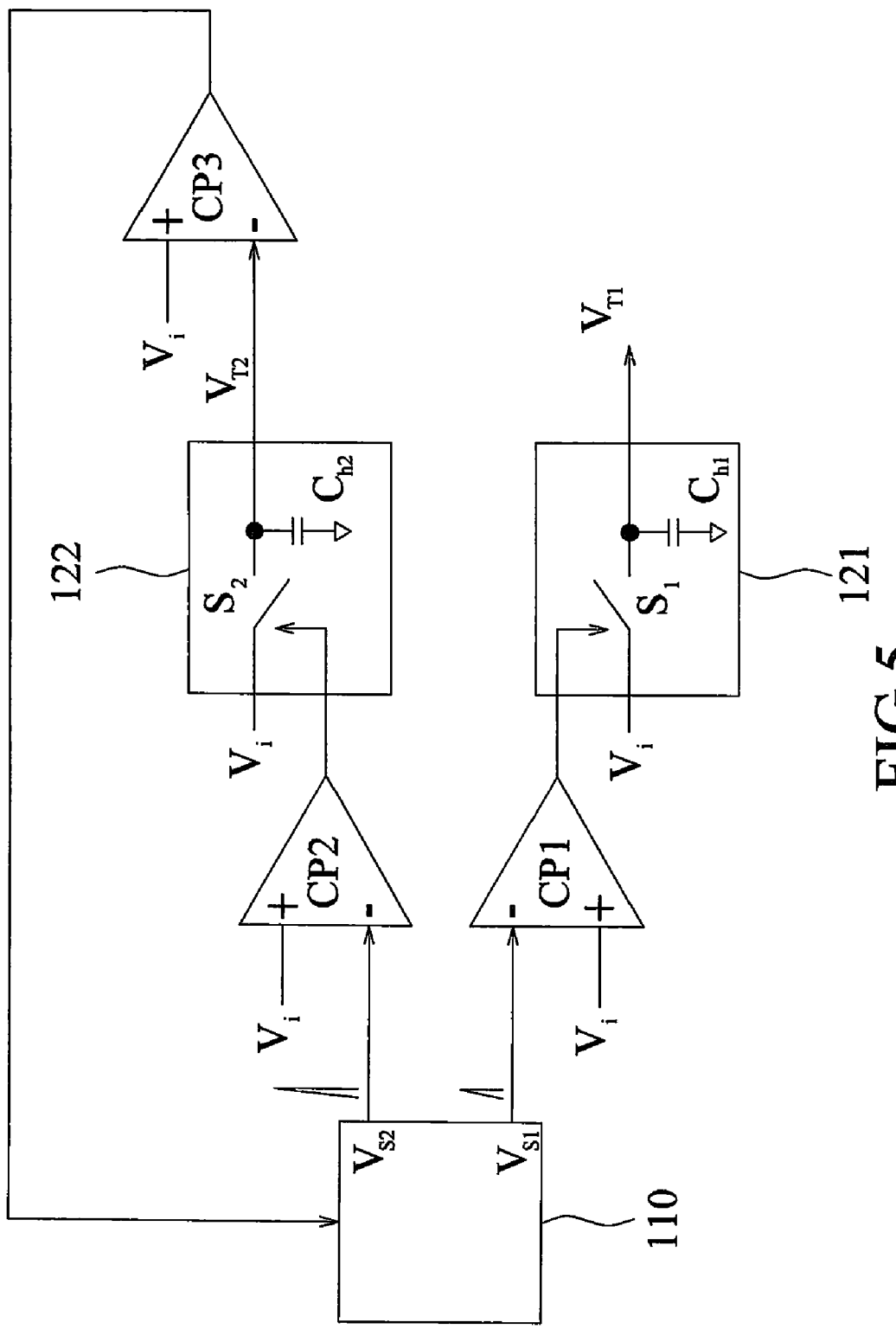
FIG. 5 is a circuit diagram illustrating the peak detect-and-hold circuit using ramp sampling technique according to an embodiment of the present invention.

FIG. 5 is the circuit diagram of the peak detect-and-hold circuit using the ramp sampling technique according to an embodiment. As illustrated in the figure, the embodiment of the peak detect-and-hold circuit includes: a sampling signal generator 110, a first comparator CP1, a first sample-and-hold circuit 121, a second comparator CP2, a second sample-and-hold circuit 122, and the third comparator CP3.

The sampling signal generator 110 generates at least a first sampling signal $V_{S1}$ and a second sampling signal $V_{S2}$, wherein the first sampling signal $V_{S1}$ and the second sampling signal $V_{S2}$ are rising waveforms, and the slope of the first sampling signal $V_{S1}$ is larger than that of the second sampling signal $V_{S2}$. The first comparator CP1 receives the first sampling signal $V_{S1}$ generated by the sampling signal generator 110 and the input voltage $V_i$, and controls the first sample-and-hold circuit 121 to track the input voltage $V_i$ with the first tracking voltage $V_{T1}$ when the first sampling signal $V_{S1}$ is smaller than the input voltage $V_i$, and to sample the input voltage $V_i$ and hold the first tracking voltage $V_{T1}$ at the sampled input voltage $V_i$ level when the first sampling signal $V_{S1}$ is equal to the input voltage $V_i$. The second comparator CP2 receives the second sampling signal $V_{S2}$ generated by the sampling signal generator 110, and controls the second sample-and-hold circuit 122 in the same manner as the first comparator CP1 controls the first sample-and-hold circuit 121. The third comparator CP3 receives the second tracking voltage $V_{T2}$ and the input voltage $V_i$, and when the second tracking voltage $V_{T2}$ is smaller than the input voltage $V_i$, the third comparator CP3 triggers the sampling signal generator 110 to generate another of the first sampling signal $V_{S1}$ and another of the second sampling signal $V_{S2}$; and when the second tracking voltage $V_{T2}$ is greater than the input voltage $V_i$, the first tracking voltage $V_{T1}$ is taken as the peak voltage.

Referring to FIG. 5, the sample-and-hold circuit 121, 122 of the peak detect-and-hold circuit according to an embodiment is a non-feedback type of sample-and-hold circuit, which includes a switch $S_1$, $S_2$, and a holding capacitor $C_{h1}$, $C_{h2}$. When the switch $S_1$, $S_2$ is turned on, the holding capacitor $C_{h1}$, $C_{h2}$ are charged, and the voltage across the holding capacitor $C_{h1}$, $C_{h2}$, i.e. the tracking voltage $V_{T1}$, $V_{T2}$, tracks the input voltage $V_i$; when the switch $S_1$, $S_2$ is turned off, the holding capacitor $C_{h1}$, $C_{h2}$ is stopped being charged, which in effect samples the input voltage $V_i$, and holds the tracking voltage $V_{T1}$, $V_{T2}$ at the sampled input voltage $V_i$.

In the present embodiment, the switch $S_1$, $S_2$ is turned on or off by the comparator CP1, CP2. The comparator CP1, CP2 turns on the switch $S_1$, $S_2$ when the sampling signal $V_{S1}$, $V_{S2}$ is generated, and turns off the switch $S_1$, $S_2$ when the sampling signal $V_{S1}$, $V_{S2}$ is equal to the input voltage $V_i$. The generation of the sampling signal $V_{S1}$, $V_{S2}$ is triggered by the comparator CP3, which compares the second tracking voltage $V_{T2}$ and the input voltage $V_i$ to determine if the peak voltage has been detected, and if not, another of the sampling signal $V_{S1}$, $V_{S2}$ should be generated. Therefore, the above-mentioned comparators CP1, CP2 and CP3 replace the conventional operational transconductance amplifier for the function of comparing the tracking voltage and the input voltage to conduct the diode and tracks the input voltage with the tracking voltage or to cutoff the diode and maintain the tracking voltage at the peak voltage. In this way, the pedestal voltage may be reduced, as explained in detail below.

First, the tracking voltage tracks the input voltage with a time delay, which is a source of comparator offset error. Conventionally, the feedback tracking voltage is used to control the voltage level of the holding capacitor $C_h$, which may cause a pedestal voltage between the input voltage and the tracking voltage. According to the present embodiment, the comparator CP1, CP2 used to drive the switch $S_1$, $S_2$ compares the sampling signal $V_{S1}$, $V_{S2}$ with the input voltage $V_i$. Since there is no time delay between the sampling signal $V_{S1}$, $V_{S2}$ and the input voltage $V_i$, the comparator offset error may be reduced. Furthermore, even the comparator CP3 for comparing the tracking voltage $V_{T2}$ and the input voltage $V_i$ may still be affected by the offset error, it is not used to drive the switch $S_1$, $S_2$ directly, but is used to determine whether the peak voltage has been detected or new sampling signals $V_{S1}$, $V_{S2}$ should be generated, thereby preventing the voltage level of the holding capacitor $C_{h1}$, $C_{h2}$ being affected by the offset error.

According to the present embodiment, the sample-and-hold circuit 121, 122 may be a non-feedback type of sample-and-hold circuit, of which the holding capacitor $C_{h1}$, $C_{h2}$ is charged directly by the input voltage $V_i$. As a result, the holding capacitor $C_{h1}$, $C_{h2}$ may be charged at most up to the same level as the input voltage $V_i$, thereby preventing the overshoot voltage, and further reducing the probability for the existence of the pedestal voltage between the tracking voltage $V_{T1}$, $V_{T2}$ and the input voltage $V_i$.

According to the present embodiment, the first tracking voltage $V_{T1}$ is taken as the peak voltage, and it is not fed back to the comparators, and hence the leakage path of the holding capacitor $C_{h1}$ through the comparator is avoided. The conventional holding capacitor $C_{h1}$ is connected to the operational transconductance amplifier and consequently the parasitic capacitor of the operational transconductance amplifier. Therefore, in comparison, the present embodiment may reduce the voltage droop by avoiding a certain leakage paths.

In conclusion, the peak detect-and-hold circuit and method thereof using the ramp sampling technique according to the present invention utilizes two sampling signals of different slopes to sample the input voltage for the tracking voltages, compares the tracking voltage sampled with the sampling signal of the lower slope with the instantaneous input voltage to determine if the input voltage is rising or falling, and takes the tracking voltage sampled with the sampling signal of the larger slope as the peak voltage when the input voltage is determined to start falling. A peak detect-and-hold circuit implementing such method is provided according to an embodiment. It compares the sampling signals of different slopes respectively with the input voltage to determine whether to turn on or off the switches of the two sample-and-hold circuits, and correspondingly keep the tracking voltages tracking the input voltage or maintain the tracking voltages at a sampled input voltage. It also compares the held tracking voltage sampled with the sampling signal of lower slope with the instantaneous input voltage to determine whether to generate the sampling signals again or to take the tracking voltage sampled with the sampling signal of the larger slope as the peak voltage. Therefore, the function of comparing the tracking voltage and the input voltage of the conventional transconductance amplifier to control whether to conduct the diode and keep the tracking voltage tracking the input voltage, or to cut off the diode and maintain the tracking voltage at a peak voltage can be replaced. Also, the holding capacitor is charged directly by the input voltage instead of the conventional operational transconductance amplifier. As a result, errors of peak detecting and holding namely, the pedestal voltage, the overshoot voltage and voltage droop are reduced.

The embodiments described above are to demonstrate the technical contents and characteristics of the preset invention to enable the persons skilled in the art to understand, make, and use the present invention. However, it is not intended to limit the scope of the present invention. Therefore, any equivalent modification or variation according to the spirit of the present invention is to be also included within the scope of the present invention.

What is claimed is:

1. A peak detect-and-hold circuit using ramp sampling technique for detecting and holding a peak voltage of an input voltage, wherein the peak detect-and-hold circuit comprises:
    a sampling signal generator producing at least a first sampling signal and a second sampling signal, wherein the first sampling signal and the second sampling signal are rising waveforms, and the slope of the first sampling signal is greater than that of the second sampling signal;
    a first comparator receiving the first sampling signal generated by the sampling signal generator and the input voltage;
    a first sample-and-hold circuit wherein the first comparator controls the first sample-and-hold circuit to keep a first tracking voltage tracking the input voltage when the first sampling signal is less than the input voltage, and to sample the input voltage and hold the first tracking voltage at the sampled input voltage when the first sampling signal is equal to the input voltage;
    a second comparator receiving the second sampling signal generated by the sampling signal generator and the input voltage;
    a second sample-and-hold circuit wherein the second comparator controls the second sample-and-hold circuit to keep a second tracking voltage tracking the input voltage when the second sampling signal is less than the input voltage, and to sample the input voltage and hold the second tracking voltage at the sampled input voltage when the second sampling signal is equal to the input voltage; and
    a third comparator receiving the second tracking voltage and the input voltage, wherein
        when the second tracking voltage is smaller than the input voltage the third comparator triggers the sampling signal generator to generate another of the first sampling signal and another of the second sampling signal; and
        when the second tracking voltage is greater than the input voltage, the first tracking voltage is taken as the peak voltage.

2. The peak detect-and-hold circuit according to claim 1, wherein the rising waveforms are linear or nonlinear.

3. The peak detect-and-hold circuit according to claim 2, wherein the rising waveforms are ramps.

4. The peak detect-and-hold circuit according to claim 3, wherein the slope of the first sampling signal is approximately two times the slope of the second sampling signal.

5. The peak detect-and-hold circuit according to claim 1, wherein the slopes of the first sampling signal and the second sampling signal are within 1% of the input voltage amplitude over its peaking time.

6. The peak detect-and-hold circuit according to claim 1, wherein the first sample-and-hold circuit is a non-feedback type of sample-and-hold circuit.

7. The peak detect-and-hold circuit according to claim 1, wherein the second sample-and-hold circuit is a non-feedback type of sample-and-hold circuit.

8. A peak detect-and-hold method using ramp sampling technique for detecting and holding a peak voltage of an input voltage, wherein the peak detect-and-hold method comprises:
    generating at least a first sampling signal and a second sampling signal, wherein the first sampling signal and the second sampling signal are rising waveforms, and the slope of the first sampling signal is greater than that of the second sampling signal;
    comparing the first sampling signal and the input voltage, wherein when the first sampling signal is smaller than the input voltage, the first tracking voltage is kept tracking the input voltage, and when the first sampling signal is equal to the input voltage, the input voltage is sampled and the first tracking voltage is held at the sampled input voltage;
    comparing the second sampling signal and the input voltage, wherein when the second sampling signal is smaller than the input voltage, the second tracking voltage is kept tracking the input voltage, and when the second sampling signal is equal to the input voltage, the input voltage is sampled and the second tracking voltage is held at the sampled input voltage; and
    comparing the second tracking voltage and the input voltage, wherein
        when the second tracking voltage is smaller than the input voltage, another of the first sampling signal and another of the second sampling signal are generated so as to proceed with the comparing steps; and
        when the second tracking voltage is greater than the input voltage, the first tracking voltage is taken as the peak voltage.

9. The peak detect-and-hold method according to claim 8, wherein the rising waveforms are linear or nonlinear.

10. The peak detect-and-hold method according to claim 9, wherein the rising waveforms are ramps.

11. The peak detect-and-hold method according to claim 10, the slope of the first sampling signal is approximately two times the slope of the second sampling signal.

12. The peak detect-and-hold method according to claim 8, the slopes of the first sampling signal and the second sampling signal are within 1% of the input voltage amplitude over its peaking time.

13. The peak detect-and-hold method according to claim 8, wherein the first tracking voltage and the second tracking voltage are generated by a first sample-and-hold circuit and a second sample-and-hold circuit, respectively.

14. The peak detect-and-hold method according to claim 13, the first sample-and-hold circuit is a non-feedback type of sample-and-hold circuit.

15. The peak detect-and-hold method according to claim 13, the second sample-and-hold circuit is a non-feedback type of sample-and-hold circuit.

* * * * *